United States Patent
Choi

(10) Patent No.: US 11,114,450 B2
(45) Date of Patent: Sep. 7, 2021

(54) ONE-TIME PROGRAMABLE MEMORY DEVICE HAVING ENHANCED PROGRAM EFFICIENCY AND METHOD FOR FABRICATING THE SAME

(71) Applicant: SK hynix system ic Inc., Chungcheongbuk-do (KR)

(72) Inventor: Kwang Il Choi, Chungcheongbuk-do (KR)

(73) Assignee: SK hynix system ic Inc., Chungcheongbuk-do (KR)

( * ) Notice: Subject to any disclaimer, the term of this patent is extended or adjusted under 35 U.S.C. 154(b) by 0 days.

(21) Appl. No.: 16/256,589

(22) Filed: Jan. 24, 2019

(65) Prior Publication Data

US 2019/0267389 A1    Aug. 29, 2019

(30) Foreign Application Priority Data

Feb. 23, 2018 (KR) .................. 10-2018-0022199

(51) Int. Cl.
| | | |
|---|---|---|
| *H01L 27/11524* | (2017.01) | |
| *H01L 27/112* | (2006.01) | |
| *H01L 27/11551* | (2017.01) | |
| *H01L 29/66* | (2006.01) | |
| *H01L 29/51* | (2006.01) | |
| *H01L 27/11529* | (2017.01) | |

(52) U.S. Cl.
CPC .. *H01L 27/11524* (2013.01); *H01L 27/11529* (2013.01); *H01L 27/11551* (2013.01); *H01L 29/51* (2013.01); *H01L 29/66825* (2013.01)

(58) Field of Classification Search
CPC ......... H01L 27/11524; H01L 27/11551; H01L 29/66825; H01L 27/11529; H01L 27/11206; H01L 27/11558
See application file for complete search history.

(56) References Cited

U.S. PATENT DOCUMENTS

| | | | | |
|---|---|---|---|---|
| 3,663,224 A | * | 5/1972 | Hallman | H01C 17/003 430/314 |
| 9,601,501 B2 | * | 3/2017 | Tsao | H01L 27/11524 |

(Continued)

FOREIGN PATENT DOCUMENTS

| | | |
|---|---|---|
| KR | 1020030057897 | 7/2003 |
| KR | 1020150125747 | 11/2015 |

*Primary Examiner* — Shahed Ahmed
*Assistant Examiner* — Khatib A Rahman
(74) *Attorney, Agent, or Firm* — IP & T Group LLP

(57) ABSTRACT

A one-time programmable (OTP) memory device includes a plurality of unit cells which are respectively located at cross points of word lines and bit lines. Each unit cell includes a selection transistor and a storage transistor coupled in series. The selection transistor includes a drain region and a common junction region separated by a first channel region and includes a selection gate structure disposed on the first channel region. The storage transistor includes a source region and the common junction region separated by a second channel region and includes a floating gate structure disposed on the second channel region. A length of an overlapping region between the source region and the floating gate structure in a channel length direction of the storage transistor is less than a length of an overlapping region between the common junction region and the floating gate structure in the channel length direction.

19 Claims, 9 Drawing Sheets

(56) References Cited

U.S. PATENT DOCUMENTS

| | | | | |
|---|---|---|---|---|
| 9,627,394 | B1* | 4/2017 | Park | H01L 27/11548 |
| 10,446,562 | B1* | 10/2019 | Horch | H01L 29/0847 |
| 2012/0164801 | A1* | 6/2012 | Yamazaki | H01L 27/1214 |
| | | | | 438/151 |
| 2014/0119122 | A1* | 5/2014 | Park | G11C 16/08 |
| | | | | 365/185.17 |
| 2015/0091074 | A1* | 4/2015 | Hsu | H01L 29/42328 |
| | | | | 257/316 |
| 2015/0318293 | A1* | 11/2015 | Lee | H01L 27/11541 |
| | | | | 257/392 |
| 2016/0020292 | A1* | 1/2016 | Kwon | H01L 29/42348 |
| | | | | 257/324 |
| 2016/0126247 | A1* | 5/2016 | Kim | H01L 29/788 |
| | | | | 257/315 |
| 2016/0293615 | A1* | 10/2016 | Kwon | H01L 27/11524 |
| 2017/0213595 | A1* | 7/2017 | Park | H01L 29/0688 |
| 2019/0147960 | A1* | 5/2019 | Menezes | H01L 29/167 |
| | | | | 365/185.12 |

* cited by examiner and method for fabricating the same.

ONE-TIME PROGRAMABLE MEMORY DEVICE HAVING ENHANCED PROGRAM EFFICIENCY AND METHOD FOR FABRICATING THE SAME

CROSS-REFERENCE TO RELATED APPLICATIONS

The present application claims priority under 35 U.S.C. 119(a) to Korean Application No. 10-2018-0022199, filed on Feb. 23, 2018, which is herein incorporated by references in its entirety.

BACKGROUND

1. Technical Field

Various embodiments of the present disclosure generally relate to a one-time programmable memory device and, more particularly, to a one-time programmable memory devices having an enhanced program efficiency and a method for fabricating the same.

2. Related Art

Nonvolatile memory devices retain their stored data even when power supply is interrupted. The nonvolatile memory devices may include read only memory (ROM) devices, magnetic disks, optical disks, flash memory devices and the like. In particular, the ROM devices may include one-time programmable (OTP) memory devices which are not capable of rewriting data. Memory cells of the OTP memory devices may be implemented by using, for example, charge storage type of memory cells or anti-fuse type of memory cells. The OTP memory cells having the charge storage type may be configured to have a stack gate structure including a floating gate disposed over a channel region of a substrate. Logical information may be stored in the OTP memory cell by injecting charges into the floating gate. Since the floating gate is electrically isolated, the charges stored in the floating gate may still remain even after a power supply voltage applied to the OTP memory cell is interrupted. The charges stored in the floating gate may have influence on a conductivity of the channel region between a source region and a drain region of the OTP memory cell. Accordingly, the information of the OTP memory cell may be read out by sensing a cell current flowing through the channel region.

SUMMARY

In accordance with an embodiment, a one-time programmable (OTP) memory device includes a plurality of unit cells which are respectively located at cross points of word lines respectively disposed in a plurality of rows and bit lines respectively disposed in a plurality of columns. Each of the plurality of unit cells includes a selection transistor and a storage transistor which are coupled in series. The selection transistor includes a drain region and a common junction region which are separated from each other by a first channel region and further includes a selection gate structure disposed over the first channel region. The storage transistor includes a source region and the common junction region which are separated from each other by a second channel region and a floating gate structure disposed over the second channel region. The drain region is coupled to any one of the bit lines. The source region is coupled to a common source line. A length of an overlapping region between the source region and the floating gate structure in a channel length direction of the storage transistor is less than a length of an overlapping region between the common junction region and the floating gate structure in the channel length direction of the storage transistor.

In accordance with an embodiment, a one-time programmable (OTP) memory device includes a plurality of active regions extending in a first direction and disposed in a well region to be spaced apart from each other in a second direction intersecting the first direction, a plurality of selection gate electrodes extending in the second direction to cross the plurality of active regions and being spaced apart from each other in the first direction, and a plurality of floating gates arrayed in a matrix form to cross the plurality of active regions and to include plural groups of floating gates. If "i" is an odd number, an $i^{th}$ selection gate electrode and an $(i+1)^{th}$ selection gate electrode among the plurality of selection gate electrodes are disposed to be adjacent to each other between an $i^{th}$ group of floating gates arrayed in the second direction among the plural groups of floating gates and an $(i+1)^{th}$ group of floating gates arrayed in the second direction among the plural groups of floating gates. Drain regions are respectively disposed in the active regions between the $i^{th}$ selection gate electrode and the $(i+1)^{th}$ selection gate electrode. Common junction regions are respectively disposed in the active regions between each of the plurality of selection gate electrodes and the floating gates adjacent thereto. Source regions are respectively disposed in the active regions between the $i^{th}$ group of floating gates and an $(i-1)^{th}$ group of floating gates among the plural groups of floating gates. A length of an overlapping region between the source region and the floating gate in the first direction is less than a length of an overlapping region between the common junction region and the floating gate in the first direction.

In accordance with an embodiment, a one-time programmable (OTP) memory device includes a plurality of unit cells. Each of the plurality of unit cells comprises a selection transistor including a drain region separated from a common junction region by a first channel region, and a storage transistor including a source region separated from the common junction region by a second channel region and a floating gate structure disposed over the second channel region. An overlapping region between the source region and the floating gate structure of the storage transistor is smaller than a length of an overlapping region between the common junction region and the floating gate structure in the channel length direction of the storage transistor.

In accordance with an embodiment, there is provided a method of fabricating a one-time programmable (OTP) memory device. The method includes forming a well region in an upper portion of a substrate and forming selection gate structures and floating gate structures over the well region. Each of the selection gate structures is formed to include a first gate insulation layer and a selection gate electrode which are sequentially stacked, and each of the floating gate structures is formed to include a second gate insulation layer and a floating gate which are sequentially stacked. Impurity ions of a first conductivity type are implanted into the well region between the floating gate structures adjacent to each other using a tilted ion implantation technique. Impurity ions of a second conductivity type are implanted into the well region between the floating gate structures adjacent to each other using a vertical ion implantation technique. Impurity ions of the second conductivity type are implanted into the well region between the floating gate structure and the selection gate structure adjacent to each other as well as between the selection gate structures adjacent to each other. The impurity ions are diffused to form source regions in the well region between the floating gate structures adjacent to each other, to form drain regions in the well region between the selection gate structures adjacent to each other, and to form common junction regions in the well region between the floating gate structure and the selection gate structure adjacent to each other.

BRIEF DESCRIPTION OF THE DRAWINGS

Various embodiments of the inventive concept will become more apparent in view of the attached drawings and accompanying detailed description, in which.

DETAILED DESCRIPTION OF THE EMBODIMENTS

In the following description of the embodiments, it will be understood that the terms "first" and "second" are intended to identify an element, but not used to define only the element itself or to mean a particular sequence. In addition, when an element is referred to as being located "on", "over", "above", "under" or "beneath" another element, it is intended to mean relative position relationship, but not used to limit certain cases that the element directly contacts the other element, or at least one intervening element is present therebetween. Accordingly, the terms such as "on", "over", "above", "under", "beneath", "below" and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly or may form a connection relationship or coupling relationship by replacing the other element therebetween.

Various embodiments are directed to one-time programmable (OTP) memory devices having an enhanced program efficiency and methods of fabricating the same.

Figure 1:
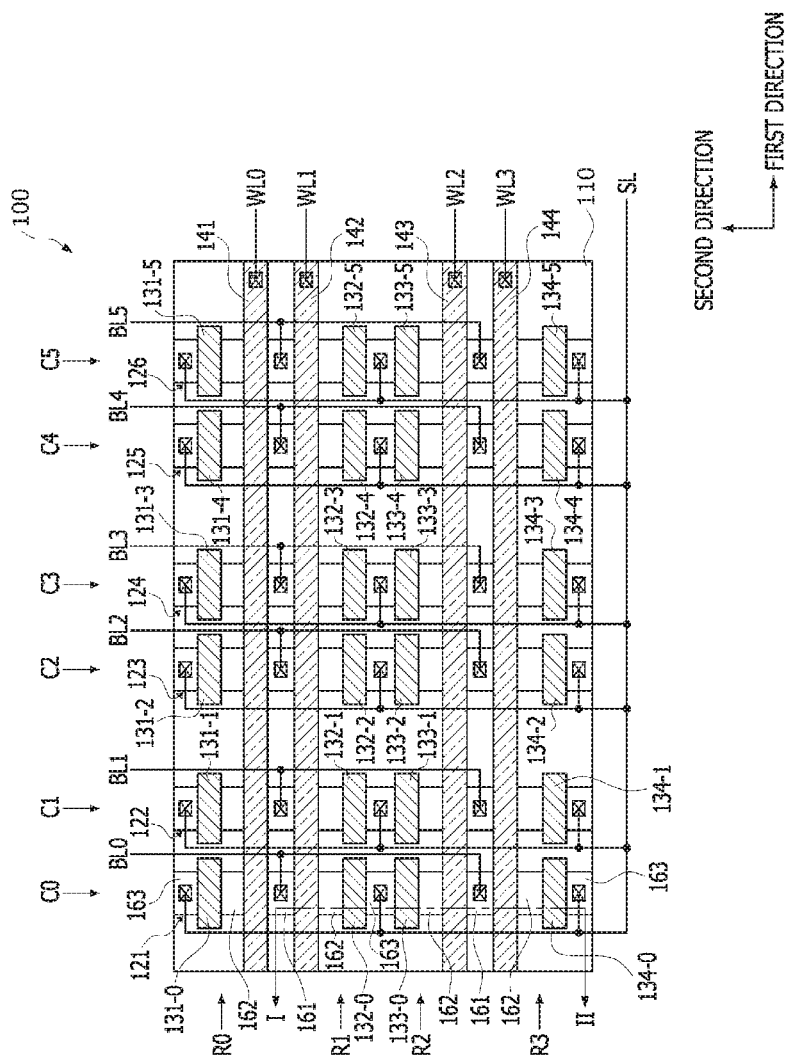
FIG. 1 is a layout diagram illustrating a one-time programmable memory device in accordance with an embodiment.
Figure 2:
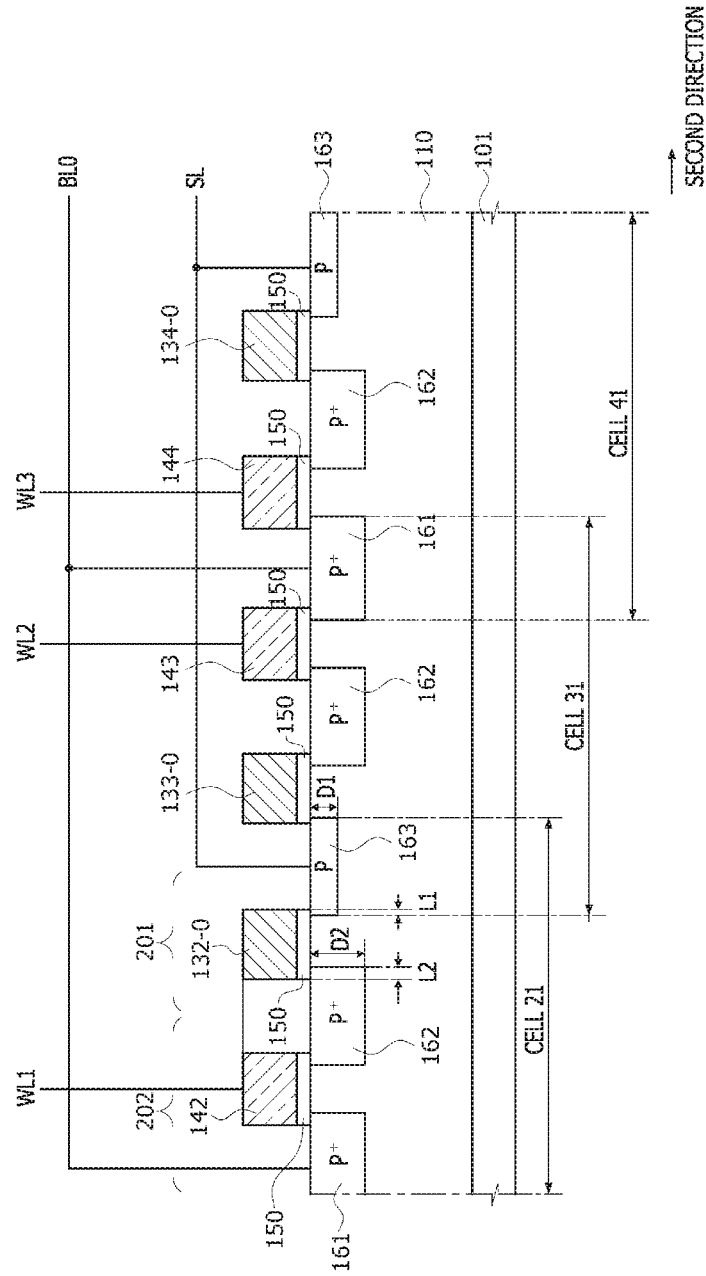
FIG. 2 is a cross-sectional view taken along a line I-II of FIG. 1.

FIG. 1 is a layout diagram illustrating a one-time programmable (OTP) memory device 100 in accordance with an embodiment, and FIG. 2 is a cross-sectional view taken along a line I-II of FIG. 1. In FIGS. 1 and 2, the same reference numerals or the same reference characters denote the same elements. Referring to FIGS. 1 and 2, the OTP memory device 100 may be configured to include a plurality of unit cells. The plurality of unit cells may be respectively located at cross points of plural word lines corresponding to rows and plural bit lines corresponding to columns to provide a cell array. FIG. 1 illustrates an example in which the unit cells are arrayed along first to fourth rows R0, R1, R2 and R3 and first to sixth columns C0, C1, C2, C3, C4 and C5. The number of the rows and the number of the columns may be set to be different. In the present embodiment, a first direction means a lateral direction in FIG. 1, and a second direction means a vertical direction in FIG. 1. The OTP memory device 100 may include a plurality of active regions, for example, first to sixth active regions 121 to 126. The first to sixth active regions 121 to 126 are arrayed along the first direction and are spaced apart from each other. The first to sixth active regions 121 to 126 may each extend in the second direction. Each of the first to sixth active regions 121 to 126 may be shared by unit cells arrayed in any one of the first to sixth columns C0, . . . and C5. Although not illustrated in the drawings, the first to sixth active regions 121 to 126 may be defined by an isolation layer. The first to sixth active regions 121 to 126 may be disposed in a well region 110 formed in a substrate 101. Thus, the first to sixth active regions 121 to 126 may be defined as portions of the well region 110, surfaces of which are exposed by the isolation layer. The well region 110 may be shared by all of unit cells which are arrayed along the rows R0, . . . and R3 and the columns C0, . . . and C5. In an embodiment, the well region 110 may be an N-type well region.

Figure 3:
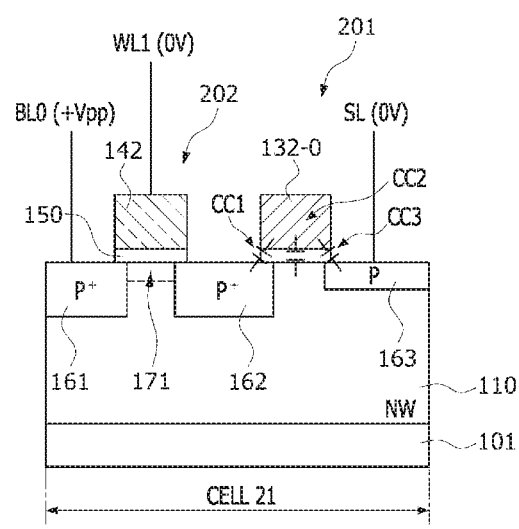
FIG. 3 is a cross-sectional view illustrating a program operation of any one selected from a plurality of unit cells included in a one-time programmable memory device in accordance with an embodiment.

Each of the unit cells may be configured to include a storage transistor 201 having a floating gate structure and a selection transistor 202 having a selection gate structure (FIG. 3). If the well region 110 is an N-type well region, each of the storage transistor 201 and the selection transistor 202 may be realized to have a P-channel MOS transistor structure. The floating gate structure may be configured to include a gate insulation layer 150 and a floating gate which are sequentially stacked over a channel region of the storage transistor 201. The selection gate structure may be configured to include the gate insulation layer 150 and a selection gate electrode which are sequentially stacked over a channel region of the selection transistor 202. The floating gates of the unit cells may be two-dimensionally disposed along the first and second directions to be spaced apart from each other. The floating gates may be allocated to the storage transistors of the unit cells, respectively. The floating gates may be disposed to be electrically isolated. That is, none of the floating gates may be coupled to signal lines. In the illustrated embodiment of FIG. 1, first floating gates 131-0, 131-1, . . . and 131-5 are disposed in the first row R0 and are arrayed in the first direction to provide the storage transistors 201 of the units cells in the first row R0, and second floating gates 132-0, 132-1, . . . and 132-5 are disposed in the second row R1 and are arrayed in the first direction to provide the storage transistors 201 of the units cells in the second row R1 Similarly, third floating gates 133-0, 133-1, . . . and 133-5 are disposed in the third row R2 and are arrayed in the first direction to provide the storage transistors 201 of the units cells in the third row R2, and fourth floating gates 134-0, 134-1, . . . and 134-5 are disposed in the fourth row R3 and are arrayed in the first direction to provide the storage transistors 201 of the units cells in the fourth row R3.

The first to fourth floating gates 131-0, 132-0, 133-0 and 134-0 are arrayed in the second direction to provide the storage transistors 201 of the unit cells arrayed in the first column C0. The first to fourth floating gates 131-1, 132-1, 133-1 and 134-1 are arrayed in the second direction to provide the storage transistors 201 of the unit cells arrayed in the second column C1. The first to fourth floating gates 131-2, 132-2, 133-2 and 134-2 are arrayed in the second direction to provide the storage transistors 201 of the unit cells arrayed in the third column C2. The first to fourth floating gates 131-3, 132-3, 133-3 and 134-3 are arrayed in the second direction to provide the storage transistors 201 of the unit cells arrayed in the fourth column C3. The first to fourth floating gates 131-4, 132-4, 133-4 and 134-4 are arrayed in the second direction to provide the storage transistors 201 of the unit cells arrayed in the fifth column C4. The first to fourth floating gates 131-5, 132-5, 133-5 and 134-5 are arrayed in the second direction to provide the storage transistors 201 of the unit cells arrayed in the sixth column C5. Thus, one of the first to fourth floating gates, for example, the first floating gate 131-0 may be included in the storage transistor 201 of the unit cell which is located at a cross point of the first row R0 and the first column C0.

First to fourth selection gate electrodes 141 to 144 may be arrayed in the second direction to be spaced apart from each other. The first to fourth selection gate electrodes 141 to 144 may be disposed to extend in the first direction. Thus, the first to fourth selection gate electrodes 141 to 144 may intersect the first to sixth active regions 121 to 126 in a plan view. If "i" is an odd number, a selection gate electrode in an $i^{th}$ row and a selection gate electrode in an $(i+1)^{th}$ row may be disposed to be adjacent to each other without any floating gates therebetween in order to minimize a layout area of the OTP memory device 100. That is, the first and second selection gate electrodes 141 and 142 may be disposed to be adjacent to each other between a first group of the floating gates 131-0, 131-1, . . . and 131-5 arrayed in the first row R0 and a second group of the floating gates 132-0, 132-1, . . . and 132-5 arrayed in the second row R1. Similarly, the third and fourth selection gate electrodes 143 and 144 may be disposed to be adjacent to each other between a third group of the floating gates 133-0, 133-1, . . . and 133-5 arrayed in the third row R2 and a fourth group of the floating gates 134-0, 134-1, . . . and 134-5 arrayed in the fourth row R3. Accordingly, both side surfaces of any one among the first to fourth selection gate electrodes 141 to 144 may face some of the floating gates and another one among the first to fourth selection gate electrodes 141 to 144, respectively.

If "m" is a natural number, a selection gate electrode disposed in an $m^{th}$ row among the plurality of selection gate electrodes may be coupled to an $m^{th}$ word line. For example, the first selection gate electrode 141 may be shared by all of the unit cells arrayed in the first row Rd and may be coupled to a first word line WL0. The second selection gate electrode 142 may be shared by all of the unit cells arrayed in the second row R1 and may be coupled to a second word line WL1. The third selection gate electrode 143 may be shared by all of the unit cells arrayed in the third row R2 and may be coupled to a third word line WL2, and the fourth selection gate electrode 144 may be shared by all of the unit cells arrayed in the fourth row R3 and may be coupled to a fourth word line WL3. As such, while all of the unit cells arrayed in a row share one selection gate electrode with each other, the unit cells arrayed in a row may respectively and independently include floating gates separated from each other.

Each of the first to sixth active regions 121 to 126 may include a plurality of junction regions which are disposed to be spaced apart from each other in the second direction. Each of drain regions 161 included in the plurality of the junction regions may be disposed in the active region between two adjacent selection gate electrodes. Thus, if "i" is an odd number, an $i^{th}$ unit cell and an $(i+1)^{th}$ unit cell among a plurality of unit cells arrayed in the same column may share any one of the drain regions 161. The drain regions 161 may be P-type regions. The drain regions 161 disposed in each active region 121, . . . or 126 may be coupled to a bit line through drain contacts. That is, if "n" is a natural number, all of drain regions disposed in an $n^{th}$ active region may be coupled to an $n^{th}$ bit line. For example, all of the drain regions 161 disposed in the first active region 121 shared by the unit cells arrayed in the first column C0 may be coupled to a first bit line BL0, and all of the drain regions 161 disposed in the second active region 122 shared by the unit cells arrayed in the second column C1 may be coupled to a second bit line BL1. In addition, all of the drain regions 161 disposed in the third active region 123 shared by the unit cells arrayed in the third column C2 may be coupled to a third bit line BL2, and all of the drain regions 161 disposed in the fourth active region 124 shared by the unit cells arrayed in the fourth column C3 may be coupled to a fourth bit line BL3. Furthermore, all of the drain regions 161 disposed in the fifth active region 125 shared by the unit cells arrayed in the fifth column C4 may be coupled to a fifth bit line BL4, and all of the drain regions 161 disposed in the sixth active region 126 shared by the unit cells arrayed in the sixth column C5 may be coupled to a sixth bit line BL5.

Each of common junction regions 162 included in the plurality of junction regions may be disposed in the active region between the floating gate and the selection gate electrode which are adjacent to each other. The common junction region 162 of a certain unit cell may act as a source region of the selection transistor 202 included in the certain unit cell and may also act as a drain region of the storage transistor 201 included in the certain unit cell. The common junction regions 162 may be P-type regions. The common junction regions 162 may be disposed to be electrically isolated. That is, none of the common junction regions 162 may be coupled to signal lines. The active region located between the drain region 161 and the common junction region 162 to overlap with any one of the selection gate electrodes may act as a channel region of the selection transistor 202. Each of source regions 163 included in the plurality of junction regions may be disposed in the active region between two adjacent floating gates. Thus, if "j" is an even number, a $j^{th}$ unit cell and an $(j+1)^{th}$ unit cell among a plurality of unit cells arrayed in the same column may share any one of the source regions 163. The source regions 163 may be P-type regions. All of the source regions 163 disposed in the active regions 121 to 126 may be coupled to a common source line SL through source contacts. That is, all the source regions 163 disposed in the active regions 121 to 126 may be coupled to the single common source line SL. The active region located between the common junction region 162 and the source region 163 to overlap with any one of the floating gates may act as a channel region of the storage transistor 201.

Structures of the junction regions 161, 162 and 163 will be described in detail hereinafter with reference to FIG. 2 in conjunction with a unit cell CELL_21 located at a cross point of the second row R1 and the first column C0, a unit cell CELL_31 located at a cross point of the third row R2 and the first column C0, and a unit cell CELL_41 located at a cross point of the fourth row R3 and the first column C0. As illustrated in FIG. 2, the unit cell CELL_21 and the unit cell CEL_31 including the floating gates 132-0 and 133-0 adjacent to each other in the second direction and may share source region 163. In addition, the unit cell CELL_31 and the unit cell CELL_41 including the selection gate electrodes 143 and 144 may be adjacent to each other in the second direction and may share drain region 161. Each of the drain region 161, the common junction region 162 and the source region 163 may have a single junction structure. The drain region 161 and the common junction region 162 may have substantially the same doping concentration. The doping concentration of the source region 163 may be lower than the doping concentration of each of the drain region 161 and the common junction region 162.

A first length L1 of a vertically overlapping region between the source region 163 and the floating gate 132-0, 133-0 or 134-0 in the second direction corresponding to a channel length direction of the storage transistor 201 having the floating gate 132-0, 133-0 or 134-0 may be less than a second length L2 of a vertically overlapping region between the common junction region 162 and the floating gate 132-0, 133-0 or 134-0 in the second direction. A first junction depth D1 of the source region 163 may be less than a second junction depth D2 of the common junction region 162. The drain region 161 may have a junction depth which is substantially equal to the second junction depth D2 of the common junction region 162. As the first length L1 is less than the second length L2, a channel length of the storage transistor 201 including the floating gate 132-0, 133-0 or 134-0 may become relatively longer compared with a case that the first length L1 is equal to the second length L2. This means that an overlap area between the floating gate 132-0, 133-0 or 134-0 and a channel region of the storage transistor 201 increases.

FIG. 3 is a cross-sectional view illustrating a program operation of any one selected from a plurality of unit cells included in a one-time programmable (OTP) memory device in accordance with an embodiment. Although FIG. 3 illustrates an example in which the unit cell CELL_21 (hereinafter, referred to as a selected unit cell) shown in FIG. 2 is programmed, the program operation illustrated in FIG. 3 may be equally applicable to other unit cells. In FIG. 3, the same reference numerals or the same reference characters as used in FIG. 2 denote the same elements. Referring to FIG. 3, a ground voltage, that is, 0 volt may be applied to the second word line WL1 coupled to the selection gate electrode 142 of the selected unit cell CELL_21 for programming the selected unit cell CELL_21, and a positive program voltage +Vpp may be applied to the well region 110 and the first bit line BL0 coupled to the drain region 161 of the selected unit cell CELL_21. In addition, the common source line SL coupled to the source region 163 may be grounded. Under the above bias condition, the selection transistor 202 of the selected unit cell CELL_21 may be turned on to form a P-type channel 171 between the drain region 161 and the common junction region 162 because the second word line WL1 is grounded. Thus, the positive program voltage +Vpp applied to the first bit line BL0 may be conducted to the common junction region 162 through the P-type channel 171.

As the positive program voltage +Vpp is conducted to the common junction region 162 and the source region 163 is grounded, a voltage difference corresponding to the positive program voltage +Vpp may be created between the common junction region 162 and the source region 163. Meanwhile, since the source region 163 is grounded and the positive program voltage +Vpp is applied to the well region 110, a reverse bias may be applied across a P-N junction between the P-type source region 163 and the N-type well region 110. Thus, a depletion region may be formed in the P-N junction region between the P-type source region 163 and the N-type well region 110. In such a case, positively charged holes in the common junction region 162 may be accelerated toward the source region 163 by the voltage difference between the common junction region 162 and the source region 163. These accelerated holes may collide with electrons and lattice atoms in the depletion region adjacent to the source region 163 to cause an impact ionization phenomenon. Electrons having high energy generated by the impact ionization phenomenon may be injected into the floating gate 132-0 through the gate insulation layer 150 by a coupling voltage Vcf induced at the floating gate 132-0. If the electrons are injected into the floating gate 132-0, a threshold voltage of the storage transistor 201 corresponding to a P-channel MOS transistor may be lowered to provide the selected unit cell CELL_21 having a programmed state.

The coupling voltage Vcf induced at the floating gate 132-0 may be determined by coupling capacitive components of the selected unit cell CELL_21. Specifically, the common junction region 162, the floating gate 132-0, and the gate insulation layer 150 between the common junction region 162 and the floating gate 132-0 may constitute a first coupling capacitive component CC1. In addition, the well region 110, the floating gate 132-0, and the gate insulation layer 150 between the well region 110 and the floating gate 132-0 may constitute a second coupling capacitive component CC2. Moreover, the source region 163, the floating gate 132-0, and the gate insulation layer 150 between the source region 163 and the floating gate 132-0 may constitute a third coupling capacitive component CC3. If predetermined voltages are respectively applied to the first bit line BL0, the second word line WL1, the common source line SL and the well region 110, an electric potential of the floating gate 132-0 may be induced by the first, second and third coupling capacitive components CC1, CC2 and CC3. That is, the coupling voltage Vcf induced at the floating gate 132-0 may be expressed by the following equation 1.

$$Vcf = \frac{(Cbl \times Vbl + Cnw \times Vnw + Csl \times Vsl)}{(Cbl + Cnw + Csl)} \quad \text{(Equation 1)}$$

In the equation 1, "Cbl", "Cnw" and "Csl" denote capacitance values of the first coupling capacitive component CC1, the second coupling capacitive component CC2 and the third coupling capacitive component CC3, respectively. In addition, "Vbl", "Vnw and "Vsl" denote a voltage applied to the first bit line BL0, a voltage applied to the well region 110, and a voltage applied to the common source line SL, respectively. During the program operation, the positive program voltage +Vpp may be applied to both of the first bit line BL0 and the well region 110 and the common source line SL may be grounded. Thus, the coupling voltage Vcf induced at the floating gate 132-0 during the program operation may be expressed by the following equation 2.

$$Vcf = \frac{(Cbl + Cnw)}{(Cbl + Cnw + Csl)} \times Vpp \quad \text{(Equation 2)}$$

As expressed by the equation 2, if the capacitance value Csl of the third coupling capacitive component CC3 is reduced, the coupling voltage Vcf induced at the floating gate 132-0 may increase. The capacitance value Csl of the third coupling capacitive component CC3 may be proportional to a vertically overlap area between the floating gate 132-0 and the source region 163. In the OTP memory device in accordance with the above embodiment, an overlap area between the floating gate 132-0 and the source region 163 may be reduced. Thus, the capacitance value Csl of the third coupling capacitive component CC3 may also be reduced. This means that a channel length of the storage transistor 201 including the floating gate 132-0 may become relatively longer. Accordingly, as the channel length of the storage transistor 201 increases, a program speed of the selected unit cell CELL_21 may be improved. In addition, the program speed may have a trade-off relationship with a program voltage. Accordingly, if the program speed of the selected unit cell CELL_21 is too fast in the allowable range, it may be possible to lower the positive program voltage +Vpp applied to the first bit line BL0 to reduce power consumption of the OTP memory device 100 during the program operation.

Figure 4:
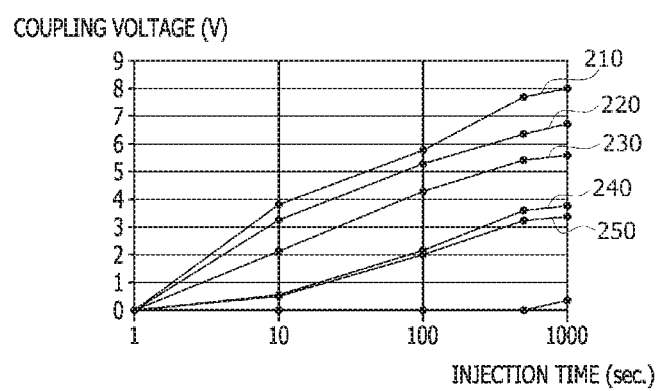
FIG. 4 is a graph illustrating a cell coupling characteristic of various OTP memory cells including storage transistors having different channel lengths.

FIG. 4 is a graph illustrating a cell coupling characteristic of various unit cells of the OTP memory device in a program mode using channel lengths of storage transistors included in the various unit cells as a parameter. In the graph of FIG. 4, the abscissa denotes an injection time representing a program time, and the ordinate denotes a coupling voltage induced at a floating gate of the selected unit cell. In the graph of FIG. 4, a curve 210 represents a cell coupling characteristic of a unit cell including a storage transistor having a channel length of 0.8 micrometers, a curve 220 represents a cell coupling characteristic of a unit cell including a storage transistor having a channel length of 0.7 micrometers, a curve 230 represents a cell coupling characteristic of a unit cell including a storage transistor having a channel length of 0.6 micrometers, a curve 240 represents a cell coupling characteristic of a unit cell including a storage transistor having a channel length of 0.5 micrometers, and a curve 250 represents a cell coupling characteristic of a unit cell including a storage transistor having a channel length of 0.4 micrometers. As illustrated in FIG. 4, it will be understood that the coupling voltage induced at the floating gate of the storage transistor (201 of FIGS. 2 and 3) increases if the channel length of the storage transistor 201 increases at the same injection time. In an embodiment, the channel length of the storage transistor 201 means an effective channel length corresponding to a distance between the common junction region 162 and the source region 163, and the floating gates 132-0 of the various OTP memory cells showing the data of FIG. 4 have the same width in the first direction. Thus, increase of the channel length of the storage transistor 201 may mean that the source region 163 is spaced apart from the floating gate 132-0 without vertically overlapping with the floating gate 132-0.

While a unit cell coupled to a selected word line and a selected bit line is selectively programmed, it may be necessary to apply appropriate bias voltages to the remaining word lines and the remaining bit lines in order to prevent non-selected unit cells from being programmed. For example, non-selected unit cells sharing the selected bit line with the selected unit cell may not be programmed by applying a positive program inhibition voltage to the remaining word lines coupled to the non-selected unit cells to turn off the selection transistors of the non-selected unit cells. In addition, non-selected unit cells sharing the selected word line with the selected unit cell may not be programmed by grounding the remaining bit lines coupled to the non-selected unit cells.

Figure 5:
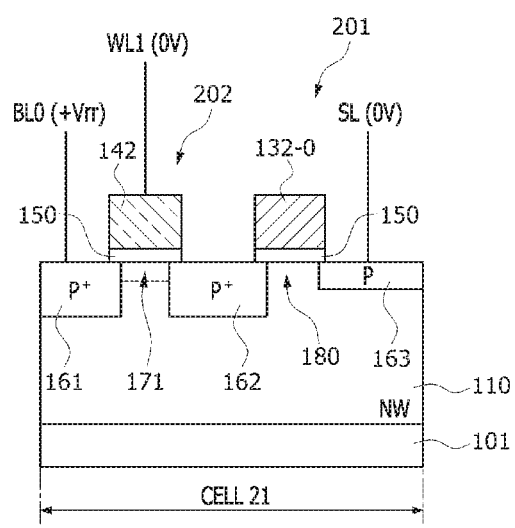
FIG. 5 is a cross-sectional view illustrating a read operation of any one selected from a plurality of unit cells included in a one-time programmable memory device in accordance with an embodiment.

FIG. 5 is a cross-sectional view illustrating a read operation of a unit cell selected from a plurality of unit cells included in an OTP memory device in accordance with an embodiment. Although FIG. 5 illustrates an example in which a datum stored in the unit cell CELL_21 (hereinafter, referred to as a selected unit cell) shown in FIG. 2 is selectively read out, the read operation illustrated in FIG. 5 may be equally applicable to other unit cells. In FIG. 5, the same reference numerals or the same reference characters as used in FIG. 2 denote the same elements. Referring to FIG. 5, the second word line WL1 coupled to the selection gate electrode 142 of the selected unit cell CELL_21 may be grounded to perform the read operation of the selected unit cell CELL_21. In addition, a positive read voltage +Vrr may be applied to the first bit line BL0 coupled to the drain region 161 of the selected unit cell CELL_21. The positive read voltage +Vrr may be lower than the positive program voltage +Vpp used during the program operation. Both of the source region 163 and the well region 110 may be grounded during the read operation of the selected unit cell CELL_21.

If the second word line WL1 is grounded, the selection transistor 202 of the selected unit cell CELL_21 may be turned on to form the P-type channel 171 between the drain region 161 and the common junction region 162. Thus, the positive read voltage +Vrr applied to the first bit line BL0 may be conducted to the common junction region 162 through the P-type channel 171. When the positive read voltage +Vrr is conducted to the common junction region 162 and the source region 163 is grounded, electrical connection between the common junction region 162 and the source region 163 may be determined according to whether an inversion channel is formed in a channel region 180 of the storage transistor 201. In order that the inversion channel is formed in the channel region 180 of the storage transistor 201, the floating gate 132-0 of the storage transistor 201 has to contain electrons therein. For example, if electrons are injected into the floating gate 132-0 during the program operation described with reference to FIG. 3, the inversion channel may be formed in the channel region 180 of the storage transistor 201 during the read operation. Thus, a cell current may flow through the P-channel 171 and the inversion channel which are formed between the drain region 161 and the source region 163 during the read operation. In contrast, if no electrons are injected into the floating gate 132-0 during the program operation described with reference to FIG. 3, no inversion channel is formed in the channel region 180 of the storage transistor 201. In such a case, no current flows through the P-channel 171 during the read operation. Accordingly, whether the selected unit cell CELL_21 has a programmed state may be determined by sensing the cell current flowing through the first bit line BL0 during the read operation.

Figure 6:
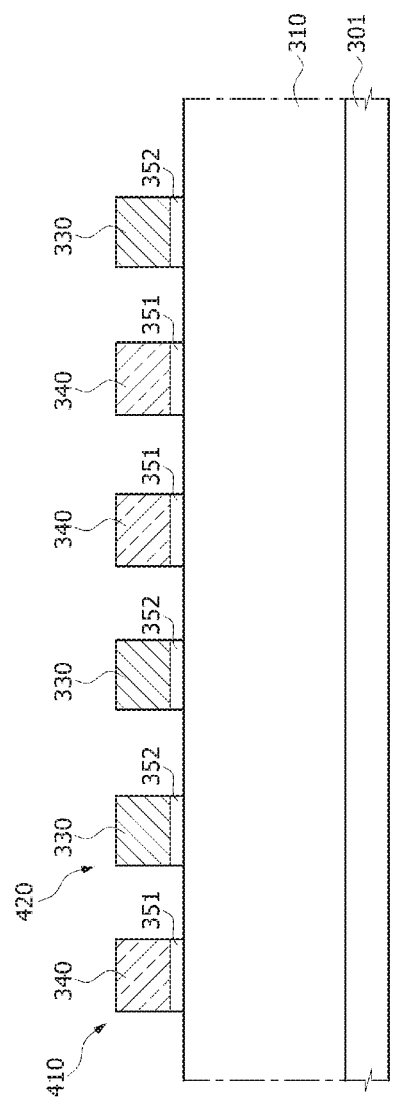
FIGS. 6 to 9 are cross-sectional views illustrating a method of fabricating a one-time programmable memory device in accordance with an embodiment.

FIGS. 6 to 9 are cross-sectional views illustrating a method of fabricating an OTP memory device in accordance with an embodiment. Referring to FIG. 6, a well region 310 may be formed in an upper portion of a substrate 301. The well region 310 may be an N-type well region. An insulation layer and a conductive layer may be sequentially formed over an entire region of the substrate 301 including the well region 310. Subsequently, the conductive layer and the insulation layer may be sequentially patterned to form selection gate structures 410 and floating gate structures 420 over the well region 310. The conductive layer and the insulation layer may be patterned using a photolithography process performed with a predetermined photomask and an etch process. Each of the selection gate structures 410 may be formed to include a first gate insulation layer 351 and a selection gate electrode 340 which are sequentially stacked. Each of the floating gate structures 420 may be formed to include a second gate insulation layer 352 and a floating gate 330 which are sequentially stacked. In an embodiment, the conductive layer and the insulation layer may be sequentially patterned such that a pair of the selection gate structures 410 and a pair of the floating gate structures 420 are alternately arrayed in a lateral direction in FIG. 6.

Figure 7:
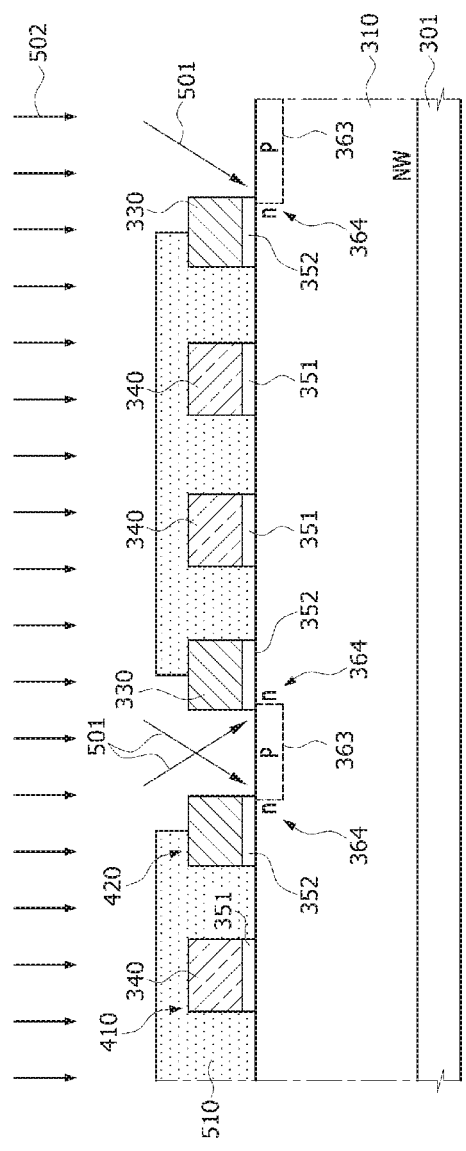

Referring to FIG. 7, a first mask pattern 510 may be formed over or on the substrate 301 to expose the well region 310 between the floating gate structures 420 that directly face each other in a lateral direction in FIG. 7. In an embodiment, the first mask pattern 510 may be formed by patterning a photoresist layer. As indicated by arrows '501' in FIG. 7, a tilted ion implantation process may be performed to implant N-type impurity ions into the exposed portions of the well region 310 using the first mask pattern 510 as an ion implantation mask. As a result, N-type impurity regions 364 may be formed in the well region 310. Subsequently, as indicated by arrows '502' in FIG. 7, a vertical ion implantation process may be performed to implant P-type impurity ions into the exposed portions of the well region 310 using the first mask pattern 510 as an ion implantation mask. As a result, P-type impurity regions 363 may be formed in the well region 310. During a subsequent thermal treatment process, lateral diffusion of the P-type impurity ions in the P-type impurity regions 363 may be efficiently suppressed because the N-type impurity regions 364 act as a lateral diffusion barrier of the P-type impurity ions in the P-type impurity regions 363. After the -type impurity ions and the P-type impurity ions are implanted into the well region 310, the first mask pattern 510 may be removed.

Figure 8:
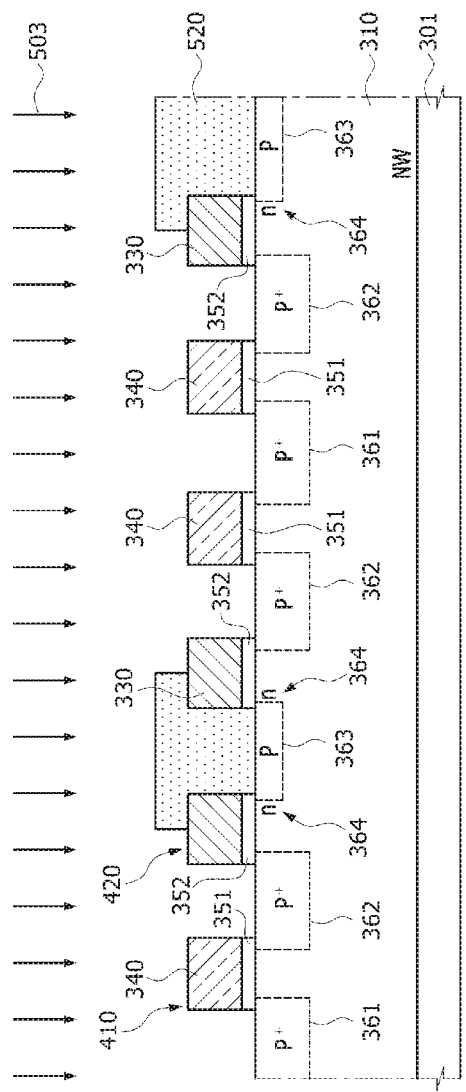

Referring to FIG. 8, a second mask pattern 520 may be formed to cover the well region 310 between the floating gate structures 420 that directly face each other in a lateral direction in FIG. 8, to expose the well region 310 between the selection gate structure 410 and the floating gate structure 420 that directly face each other in the lateral direction in FIG. 8, and to expose the well region 310 between the selection gate structures 410 that directly face each other in the lateral direction in FIG. 8. The second mask pattern 520 may be formed to have a reverse pattern of the first mask pattern 510. In an embodiment, the second mask pattern 520 may be formed by patterning a photoresist layer. As indicated by arrows '503' in FIG. 8, a vertical ion implantation process may be performed to implant P-type impurity ions into the exposed portions of the well region 310 using the second mask pattern 520 as an ion implantation mask. As a result, P-type impurity regions 361 and 362 may be formed in the well region 310. That is, the P-type impurity regions 361 may be formed in the well region 310 between the selection gate structures 410 that directly face each other in the lateral direction, and the P-type impurity regions 362 may be formed in the well region 310 between the selection gate structure 410 and the floating gate structure 420 that directly face each other in the lateral direction. The P-type impurity ions for forming the P-type impurity regions 361 and 362 may be implanted to a higher dose with a higher energy as compared with the P-type impurity ions for forming the P-type impurity regions 363 illustrated in FIG. 7. After the P-type impurity regions 361 and 362 are formed, the second mask pattern 520 may be removed.

Figure 9:
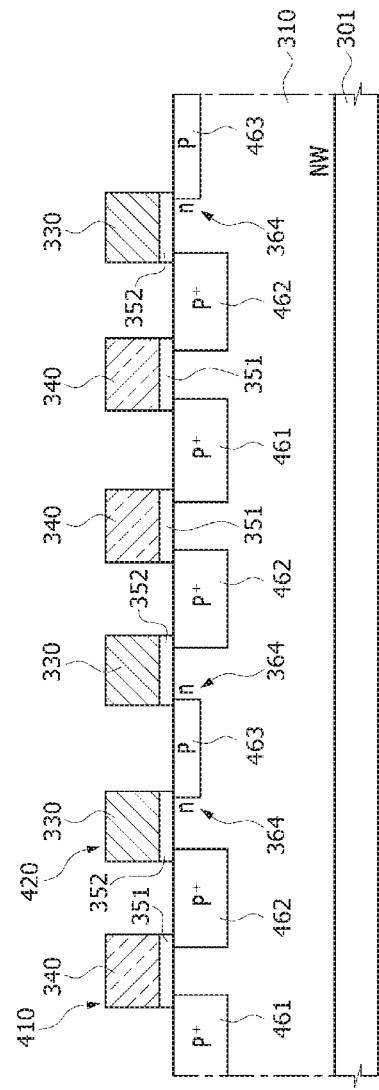

Referring to FIGS. 8 and 9, the P-type impurity ions in the P-type impurity regions 361, 362 and 363 may be diffused and activated by a diffusion process to form P-type drain regions 461, P-type common junction regions 462 and P-type source regions 463. Since a dose and an implantation energy of the P-type impurity ions for forming the P-type impurity regions 363 are lower than a dose and an implantation energy of the P-type impurity ions for forming the P-type impurity regions 361 and 362, the P-type impurity ions in the P-type impurity regions 363 may be less diffused as compared with the P-type impurity ions in the P-type impurity regions 361 and 362 during the diffusion process for forming the drain regions 461, the common junction regions 462 and the source regions 463. Thus, a junction depth of the source regions 463 may be less than a junction depth of the drain regions 461 and the common junction regions 462. In addition, since the N-type impurity regions 364 are formed at both sides of each of the P-type impurity regions 363, the lateral diffusion of the P-type impurity ions in the P-type impurity regions 363 may be more suppressed during the diffusion process for forming the drain regions 461, the common junction regions 462 and the source regions 463. Accordingly, an overlap area between the source region 463 and the floating gate 330 may be less than an overlap area between the common junction region 462 and the floating gate 330.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. A one-time programmable (OTP) memory device including a plurality of unit cells which are respectively located at cross points of word lines respectively disposed in a plurality of rows and bit lines respectively disposed in a plurality of columns, wherein each of the plurality of unit cells comprising:
   a selection transistor comprising a drain region separated from a common junction region by a first channel region, and a selection gate structure disposed over the first channel region; and
   a storage transistor comprising a source region separated from the common junction region by a second channel region, and a floating gate structure disposed over the second channel region,
   wherein the drain region is coupled to any one of the bit lines,
   wherein the source region is coupled to a common source line,
   wherein a length of an overlapping region between the source region and the floating gate structure in a channel length direction of the storage transistor is less than a length of an overlapping region between the common junction region and the floating gate structure in the channel length direction of the storage transistor, and
   wherein the source region and the common junction region are formed after the floating gate structure and the selection gate structure are formed.

2. The OTP memory device of claim 1, wherein the selection transistor and the storage transistor include a P-channel MOS transistor structure.

3. The OTP memory device of claim 1, wherein the drain region and the common junction region include a P-type impurity concentration which is higher than a P-type impurity concentration of the source region.

4. The OTP memory device of claim 3, further comprising an N-type well region that surrounds bottom surfaces and side surfaces of all of the drain region, the common junction region and the source region.

5. The OTP memory device of claim 1, wherein each of the common junction region and the source region includes a single junction structure.

6. The OTP memory device of claim 1, wherein a junction depth of the source region is less than a junction depth of the common junction region.

7. The OTP memory device of claim 1,
wherein the selection gate structure includes a first gate insulation layer disposed over the first channel region and a selection gate electrode disposed over the first gate insulation layer and coupled to one of the word lines; and
wherein the floating gate structure includes a second gate insulation layer disposed over the second channel region and a floating gate disposed over the second gate insulation layer.

8. The OTP memory device of claim 7,
wherein the selection transistor and the storage transistor include a P-channel MOS transistor structure; and
wherein the OTP memory device performs a program operation of one selected from the plurality of unit cells if the common source line and one of the word lines are grounded and a positive program voltage is applied to one of the bit lines.

9. The OTP memory device of claim 7,
wherein the selection transistor and the storage transistor include a P-channel MOS transistor structure; and
wherein the OTP memory device performs a read operation of one selected from the plurality of unit cells if the common source line and one of the word lines are grounded and a positive read voltage is applied to one of the bit lines.

10. A one-time programmable (OTP) memory device comprising:
a plurality of active regions extending in a first direction and disposed in a well region to be spaced apart from each other in a second direction intersecting the first direction;
a plurality of selection gate electrodes extending in the second direction to cross the plurality of active regions and being spaced apart from each other in the first direction; and
a plurality of floating gates arrayed in a matrix form to cross the plurality of active regions and to include plural groups of floating gates,
wherein if "i" is an odd number, an $i^{th}$ selection gate electrode and an $(i+1)^{th}$ selection gate electrode among the plurality of selection gate electrodes are disposed to be adjacent to each other between an $i^{th}$ group of floating gates arrayed in the second direction among the plural groups of floating gates and an $(i+1)^{th}$ group of floating gates arrayed in the second direction among the plural groups of floating gates,
wherein drain regions are respectively disposed in the active regions between the $i^{th}$ selection gate electrode and the $(i+1)^{th}$ selection gate electrode,
wherein common junction regions are respectively disposed in the active regions between each of the plurality of selection gate electrodes and the floating gates adjacent thereto;
wherein source regions are respectively disposed in the active regions between the $i^{th}$ group of floating gates and an $(i-1)^{th}$ group of floating gates among the plural groups of floating gates,
wherein a length of an overlapping region between the source region and the floating gate in the first direction is less than a length of an overlapping region between the common junction region and the floating gate in the first direction, and
wherein the source region and the common junction region are formed after the floating gate structure and the selection gate structure are formed.

11. The OTP memory device of claim 10,
wherein if "j" is a natural number, a $j^{th}$ active region among the plurality of active regions is shared by unit cells formed in a $j^{th}$ column among a plurality of columns;
wherein a $j^{th}$ selection gate electrode among the plurality of selection gate electrodes is shared by unit cells formed in a $j^{th}$ row among a plurality of rows; and
wherein each of the plurality of floating gates is included in any one of the unit cells.

12. The OTP memory device of claim 10, wherein the $i^{th}$ selection gate electrode and the $(i+1)^{th}$ selection gate electrode are disposed between an $i^{th}$ floating gate and an $(i+1)^{th}$ floating gate arrayed in the first direction among the plurality of floating gates.

13. The OTP memory device of claim 10,
wherein an $m^{th}$ selection gate electrode among the plurality of selection gate electrodes is coupled to an $m^{th}$ word line among a plurality of word lines;
wherein all of the drain regions disposed in an $n^{th}$ active region among the plurality of active regions are coupled to an $n^{th}$ bit line among a plurality of bit lines; and
wherein all of the source regions disposed in the plurality of active regions are coupled to a common source line.

14. The OTP memory device of claim 13,
wherein the well region is an N-type well region;
wherein the drain regions, the common junction regions and the source regions are P-type regions;
wherein the drain regions and the common junction regions have an impurity concentration which is higher than an impurity concentration of the source regions; and
wherein one selected from a plurality of unit cells included in the OTP memory device is programmed by grounding the word line coupled to the selected unit cell and the common source line, by applying a positive program voltage to the bit line coupled to the selected unit cell, by applying a positive program inhibition voltage to the remaining word lines, and by grounding the remaining bit lines.

15. The OTP memory device of claim 13,
wherein the well region is an N-type well region;
wherein the drain regions, the common junction regions and the source regions are P-type regions;
wherein the drain regions and the common junction regions have an impurity concentration which is higher than an impurity concentration of the source regions; and
wherein a datum stored in one selected from a plurality of unit cells included in the OTP memory device is read out by grounding the word line coupled to the selected unit cell and the common source line and by applying a positive read voltage to the bit line coupled to the selected unit cell.

16. The OTP memory device of claim 10, wherein each of the common junction regions and the source regions includes a single junction structure.

17. The OTP memory device of claim 10, wherein a junction depth of the source regions is less than a junction depth of the common junction regions.

18. A one-time programmable (OTP) memory device including a plurality of unit cells, each of the plurality of unit cells comprising:

a selection transistor including a drain region separated from a common junction region by a first channel region; and a storage transistor including a source region separated from the common junction region by a second channel region and a floating gate structure disposed over the second channel region, wherein a length of an overlapping region between the source region and the floating gate structure of the storage transistor is smaller than a length of an overlapping region between the common junction region and the floating gate structure in the channel length direction of the storage transistor, and wherein the source region and the common junction region are formed after the floating gate structure and the selection gate structure are formed.

19. A one-time programmable (OTP) memory device including a plurality of unit cells which are respectively located at cross points of word lines respectively disposed in a plurality of rows and bit lines respectively disposed in a plurality of columns, wherein each of the plurality of unit cells comprises:

a selection transistor including a drain region separated from a common junction region by a first channel region; and a storage transistor including a source region separated from the common junction region by a second channel region and a floating gate structure disposed over the second channel region, wherein the drain region, the common junction region, and the source region are disposed in a well region, wherein the drain region is coupled to any one of the bit lines, wherein the source region is coupled to a common source line, wherein a length of an overlapping region between the source region and the floating gate structure in a channel length direction of the storage transistor is less than a length of an overlapping region between the common junction region and the floating gate structure in the channel length direction of the storage transistor, wherein the OTP memory device is programmed by applying a ground voltage to the common source line and by applying a positive program voltage to the one of the bit lines and the well region, and wherein the source region and the common junction region are formed after the floating gate structure and the selection gate structure are formed.

* * * * *